United States Patent
Starman et al.

(10) Patent No.: US 11,163,152 B2
(45) Date of Patent: Nov. 2, 2021

(54) MEMS ELECTROTHERMAL ACTUATOR FOR LARGE ANGLE BEAMSTEERING

(71) Applicant: Government of the United States, as represented by the Secretary of the Air Force, Wright-Patterson AFB, OH (US)

(72) Inventors: LaVern A Starman, Dayton, OH (US); John P K Walton, Troy, OH (US); David Torres Reyes, Springboro, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 216 days.

(21) Appl. No.: 16/671,736

(22) Filed: Nov. 1, 2019

(65) Prior Publication Data
US 2020/0096761 A1    Mar. 26, 2020

Related U.S. Application Data

(63) Continuation-in-part of application No. 16/052,018, filed on Aug. 1, 2018.
(Continued)

(51) Int. Cl.
*G02B 26/08*    (2006.01)
*B81B 3/00*    (2006.01)
*B81C 1/00*    (2006.01)

(52) U.S. Cl.
CPC ........ *G02B 26/0866* (2013.01); *B81B 3/0043* (2013.01); *B81C 1/0038* (2013.01); *B81B 2201/032* (2013.01); *B81B 2201/042* (2013.01)

(58) Field of Classification Search
CPC .............. G02B 26/0866; B81B 3/0043; B81B 2201/032; B81B 2201/042;
(Continued)

(56) References Cited

U.S. PATENT DOCUMENTS

| 6,545,385 B2 | 4/2003 | Miller et al. |
| 6,600,851 B2 | 7/2003 | Aksyuk et al. |

(Continued)

OTHER PUBLICATIONS

Cowen et al., "PolyMUMPs™ Design Handbook, Revision 13.0.," MEMSCAP Inc., 3021 Cornwallis Road, Research Triangle Park, NC, (2011).
(Continued)

*Primary Examiner* — Euncha P Cherry
(74) *Attorney, Agent, or Firm* — AFMCLO/JAZ; Charles Figer, Jr.

(57) ABSTRACT

An actuator element of a MEMS device on a substrate is provided to create large, out-of-plane deflection. The actuator element includes a metallic layer having a first portion contacting the substrate and a second portion having an end proximal to the first portion. A distal end is cantilevered over the substrate. A first insulating layer contacts the metallic layer on a bottom contacting surface of the second cantilevered portion from the proximal to the distal end. A second insulating layer contacts the metallic layer on a portion of a top contacting surface at the distal end. The second portion of the metallic layer is prestressed. A coefficient of thermal expansion of the first and second insulating layers is different than a coefficient of thermal expansion of the metallic layer. And, a Young's modulus of the first and second insulating layer is different than a Young's modulus of the metallic layer.

16 Claims, 11 Drawing Sheets

Related U.S. Application Data

(60) Provisional application No. 62/540,177, filed on Aug. 2, 2017, provisional application No. 62/587,734, filed on Nov. 17, 2017, provisional application No. 62/589,610, filed on Nov. 22, 2017, provisional application No. 62/667,647, filed on May 7, 2018, provisional application No. 62/702,595, filed on Jul. 24, 2018.

(58) Field of Classification Search
CPC ........ B81B 2203/053; B81B 2203/058; B81B 2201/047; B81B 2203/0109; B81B 2203/0163; B81B 3/0037; B81C 1/0038
USPC ...................................................... 359/221.2
See application file for complete search history.

(56) References Cited

U.S. PATENT DOCUMENTS

| | | |
|---|---|---|
| 6,628,857 B1 | 9/2003 | Bonadeo et al. |
| 6,632,373 B1 | 10/2003 | Rosa et al. |
| 6,701,037 B2 | 3/2004 | Staple et al. |
| 6,795,603 B2 | 9/2004 | Utsunomiya |
| 6,829,069 B2 | 12/2004 | Buzzetta |
| 7,005,775 B2 | 2/2006 | Wan |
| 7,057,251 B2 | 6/2006 | Reid |
| 7,148,603 B1 | 12/2006 | Gracia et al. |
| 7,677,742 B2 | 3/2010 | Hillmer et al. |
| 8,537,446 B2 | 9/2013 | Lal et al. |
| 9,587,632 B2 * | 3/2017 | Dimascio .................. F03G 7/06 |
| 9,664,896 B1 | 5/2017 | Yasumura |
| 2010/0030627 A1 | 2/2010 | Lee et al. |
| 2010/0033788 A1 | 2/2010 | Xie et al. |

OTHER PUBLICATIONS

Todd et al., "A Multi-Degree-of-Freedom Micromirror Utilizing Inverted-Series-Connected Bimorph Actuators," J. of Optics A: Pure and Applies Optics, vol. 8, pp. S352-S359, 2006.

Wu et al., "A Tip-Tilt-Piston Micromirror Array for Optical Phased Array Applications," J. of Microelectromechanical Systems, vol. 19, No. 6, pp. 1450-1461, 2010.

Jia et al., "An Electrothermal Tip-Tilt-Piston Micromirror Based on Folded Dual S-Shaped Bimorphs," J. of Microelectromechanical Systems, vol. 18, No. 5, pp. 1004-1015, 2009.

Samuelson et al., "A Large Piston Displacement MEMS Mirror with Electrothermal Ladder Actuator Arrays for Ultra-Low Tilt Applications," J. of Microelectromechanical Systems, vol. 23, No. 1, pp. 39-49, 2014.

* cited by examiner

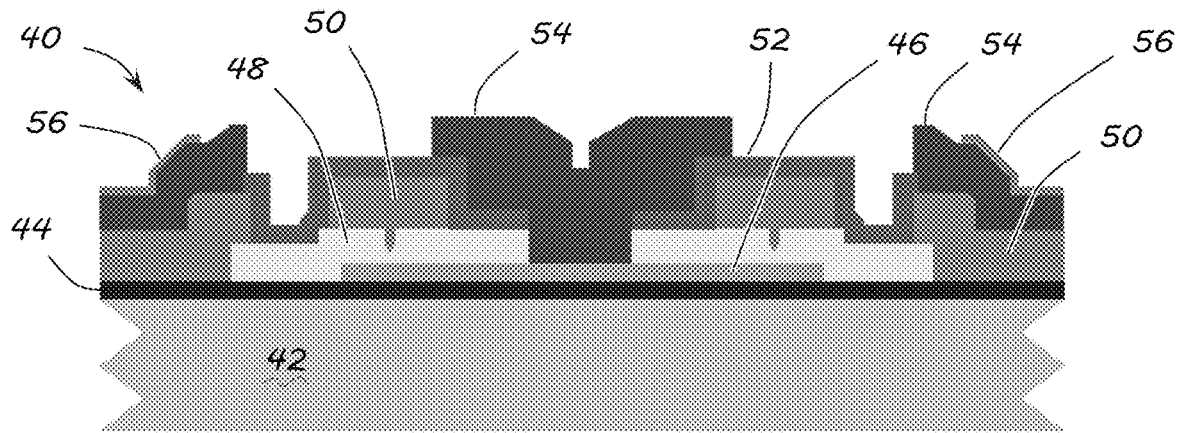

*FIG. 9A*

| MATERIAL LAYER | LAYER THICKNESS | LAYER DESCRIPTION |
|---|---|---|
| NITRIDE (44) | 0.6 μm | PROVIDE ELECTRICAL ISOLATION FROM WAFER |
| POLY0 (46) | 0.5 μm | ELECTRICAL LAYER FOR GROUND PLANE/ELECTRODE FORMATION |
| 1ST OXIDE (48) | 2.0 μm | FIRST SACRIFICIAL LAYER PROVIDEING GAP BETWEEN POLY0 AND POLY1 LAYERS |
| POLY1 (50) | 2.0 μm | FIRST MECHANICAL LAYER |
| 2ND OXIDE (52) | 0.75 μm | SECOND SACRIFICIAL LAYER PROVIDING GAP BETWEEN POLY1 AND POLY2 |
| POLY2 (54) | 1.5 μm | SECOND MECHANICAL LAYER |
| METAL (56) | 0.5 μm | ELECTRICAL CONTACT LAYER OR OPTICALLY REFLECTIVE SURFACE |

*FIG. 9B*

MEMS ELECTROTHERMAL ACTUATOR FOR LARGE ANGLE BEAMSTEERING

CROSS-REFERENCE TO RELATED APPLICATIONS

This application is a continuation-in-part of U.S. application Ser. No. 16/052,018, entitled "MEMS Device for Large Angle Beamsteering,", which claims the benefit of and priority to U.S. Provisional Application Ser. No. 62/540,177, entitled "Post-Processing Techniques on MEMS Foundry Fabricated Devices for Large Angle Beamsteering," filed on Aug. 2, 2017, and U.S. Provisional Application Ser. No. 62/587,734, entitled "Segmented Control of Electrostatically Actuated Bi-Morph Beams," filed on Nov. 17, 2017, and U.S. Provisional Application Ser. No. 62/589,610, entitled "Using Surface Micromaching to Create Large Tip, Tilt, and Piston MEMS Beamsteering Structures," filed on Nov. 22, 2017, and U.S. Provisional Application Ser. No. 62/667,647, entitled "Torsional Structures to Enable Large Angle Deflections," filed on May 7, 2018, and U.S. Provisional Application Ser. No. 62/702,595, entitled "Torsional Springs to Enable Large Angle Tip/Tilt Beamsteering using MEMS," filed on Jul. 24, 2018, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to MEMS devices and, more particularly, MEMS devices capable of large angle deflections.

Description of the Related Art

Within the past decade, numerous researches have invested time in the development of micro-electro-mechanical systems (MEMS) micromirror structures, which have the ability to deflect at large angles (greater than 20 degrees). These large tip/tilt micromirrors are ideal for many applications to include microscopy, biomedical endoscopy, laser communication, wavelength selectivity, optical tuning, scene generation and various other medical instrumentations. Although many of these research efforts exhibit large tip/tilt angles, they generally do not include a piston motion for optical correction requirements or exhibit high fill-factors for large area optical scanning applications.

There currently are no large angle electrothermal beamsteering approaches which exhibit large tip/tilt and piston motion while creating a >90% fill-factor. Contemporary electrothermal designs have a maximum tip or tilt of ±30° for a single element but generally do not possess both capabilities. No approach with a tip or tilt angle of >10° are available which has a high fill-factor. Most if not all designs with a high fill-factor have tilt angles of less than 5°. Having devices which exhibit large tip/tilt and piston motion while creating a >90% fill-factor is very important to organizations such as the Air Force as significant interest is being placed on all platforms to reduce or essentially eliminate the numerous gimbal based systems, which protrude from the platform. These protrusions create significant drag resulting in the inefficiency of the platform and increase fuel usage. These devices may also be critical elements in UAV applications since they are extremely small, lightweight and consume minimal power. Commercially, many of the same gimbal systems on aerial platforms could be replaced as well as increased medical imaging applications. Also, they would be ideal for the auto industry for future camera systems.

Accordingly, there is a need in the art for MEMS micromirrors for large angle beamsteering for numerous broadband steering and imaging applications.

SUMMARY OF THE INVENTION

Embodiments of the invention address the need in the art by enabling new and improved beamsteering systems with large beamsteering angles, high scanning speeds, while exhibiting high fill-factor (>90%) arrays which are scalable to large aperture sizes as well as enabling a multi-beam scanning capability at low voltage. These embodiments may replace many gimbal based systems in a variety of applications since the device is nearly conformal, and it can eliminate nearly all large, moving mechanical parts of the scanning/detector system. Embodiments of the invention may be applicable to EO/IR beamsteering systems, medical endoscopy, imaging and scene generation systems, laser communications, and multi-target search and track. Embodiments of the invention use MEMS to enable the large angle beamsteering, scalable with regard to array size, flexible with regards to material selection, wavelengths of interest, and deflection/steering angles while being ideal for wideband applications.

Embodiments of the invention include an actuator element of a MEMS device on a substrate capable of creating large, out-of-plane deflection. In these embodiments, the actuator element may include a metallic layer having a first portion contacting the substrate and a second portion having an end proximal to the first portion and distal end cantilevered over the substrate. A first insulating layer may contact, in some embodiments, the metallic layer on a bottom contacting surface of the second cantilevered portion from the proximal end to the distal end. A second insulating layer may contact the metallic layer on a portion of a top contacting surface at the distal end. The second portion of the metallic layer may be prestressed, and in some embodiments, a coefficient of thermal expansion of the first and second insulating layers is different than a coefficient of thermal expansion of the metallic layer. Additionally, a Young's modulus of the first and second insulating layer is different than a Young's modulus of the metallic layer.

In some of these embodiments, the portion of the top contacting surface spans from the distal end to a location half way between the proximal and distal ends. In some embodiments, the coefficient of thermal expansion of the first and second insulating layers may be the same for both layers. In other embodiments, the coefficient of thermal expansion of the first insulating layer may be different that the coefficient of thermal expansion of the second insulating layer. In some embodiments, the second portion of the metallic layer is tensilely prestressed. In these and other embodiments, the metallic layer material may consist of gold, aluminum, chromium, titanium, platinum, copper, nickel, and etc. In these embodiments, the first and second insulating layers material may consist of silicon dioxide, silicon nitride, hafnium oxide, aluminum oxide, etc. In still further embodiments, individual actuator elements may be connected together by having the first portion of the metallic layer contacting the distal end of the second portion of an existing actuator instead of the substrate.

Embodiments of the invention may be created by depositing a first portion of a metallic layer on a substrate. A sacrificial layer is deposited proximate the first portion of the metallic layer. A first dielectric is deposited on the sacrificial layer. A second portion of the metallic layer is deposited on the first dielectric. The second portion of the metallic layer has an end proximal to and contacting at least part of the first portion of the metallic layer and a distal end. The second portion of the metallic layer further spans from the proximal end to the distal end. A second dielectric is deposited on a portion of the second portion of the metallic layer at the distal end. Finally, the sacrificial layer is removed.

Additional objects, advantages, and novel features of the invention will be set forth in part in the description, which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 9A illustrates the PolyMUMPs foundry fabrication layers for an exemplary device;

FIG. 9B contains a table with material layer descriptions and thicknesses of the PolyMUMP foundry fabrication for an exemplary device in FIG. 9A.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

An objective of embodiments of the invention is to enable new and improved beamsteering systems with large beam-steering angles, high scanning speeds, while exhibiting high fill-factor (>90%) arrays, which may be scalable to large aperture sizes as well as enabling a multi-beam scanning capability at low voltage. Embodiments of the invention may be used to replace many gimbal based systems in a variety of applications since the devices are nearly conformal, and can eliminate nearly all large, moving mechanical parts of the scanning/detector system. Embodiments of the invention would be applicable to EO/IR beamsteering systems, medical endoscopy, imaging and scene generation systems, laser communications, and multi-target search and track. Contemporary systems use gimbal systems, which are slow, with a single beamsteering direction, and no multi-target capability. Some advantages of associated with the embodiments of the invention is it can remove most mechanical/gimbal based systems on a platform, can enable multi-beam steering, operate at low voltages, system can be nearly conformal, adaptable and scalable to meet a wide range of applications. Some embodiments of the invention use MEMS to enable the large angle beamsteering, scalable with regard to array size, flexible with regards to material selection, wavelengths of interest, and deflection/steering angles while being ideal for wideband applications.

Figure 1A:
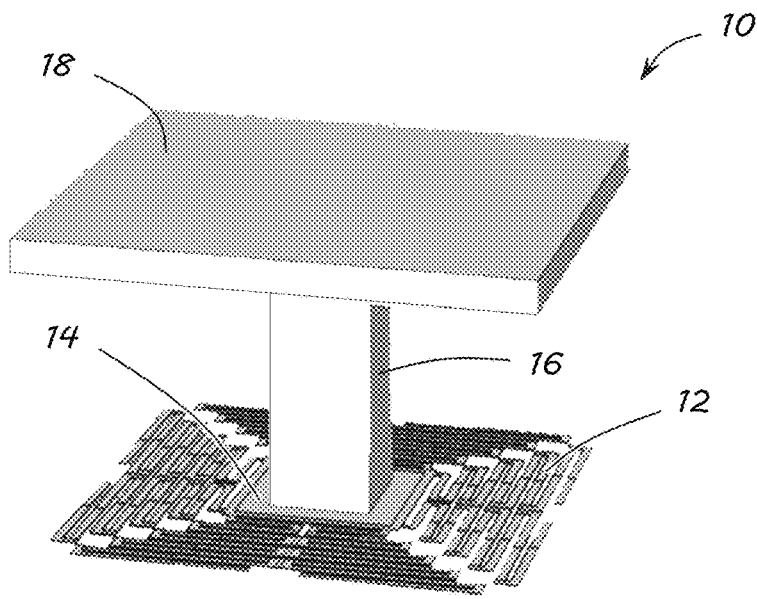
FIG. 1A illustrates an exemplary large angle beamsteering micromirror design concept using the center contact design approach.

FIG. 1A illustrates an exemplary center contact structural design concept with a silicon on insulator (SOI) micromirror bonded onto a bonding pad of the actuator assembly. FIG. 1A shows the basic design concept 10 with the cantilever style beams 12 attached to a bonding platform 14. This bonding platform 14 is used to bond and support the micromirror pillar 16 and mirror plate 18 to enable the deflection and piston motion. In this design, the entire structure used for actuation may be fabricated on a single wafer while the micromirror pillar and mirror may be fabricated from an SOI wafer or some other surface micromachining technique.

Figure 1B:
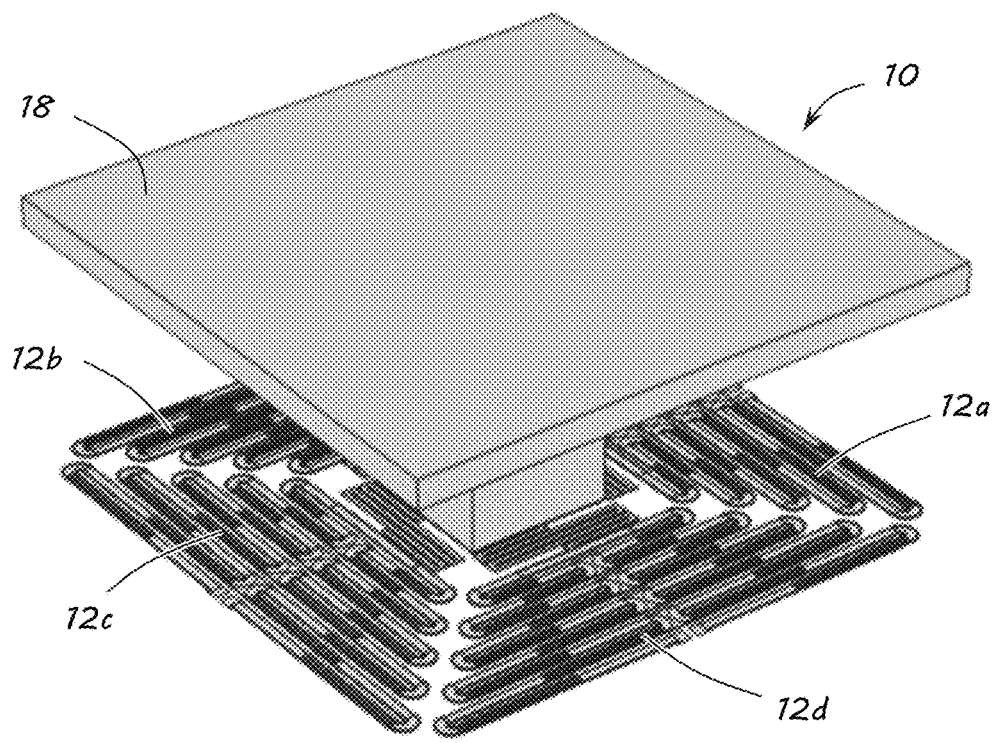
FIG. 1B illustrates another exemplary actuation assembly integrated with the micromirror-post assembly.
Figure 1C:
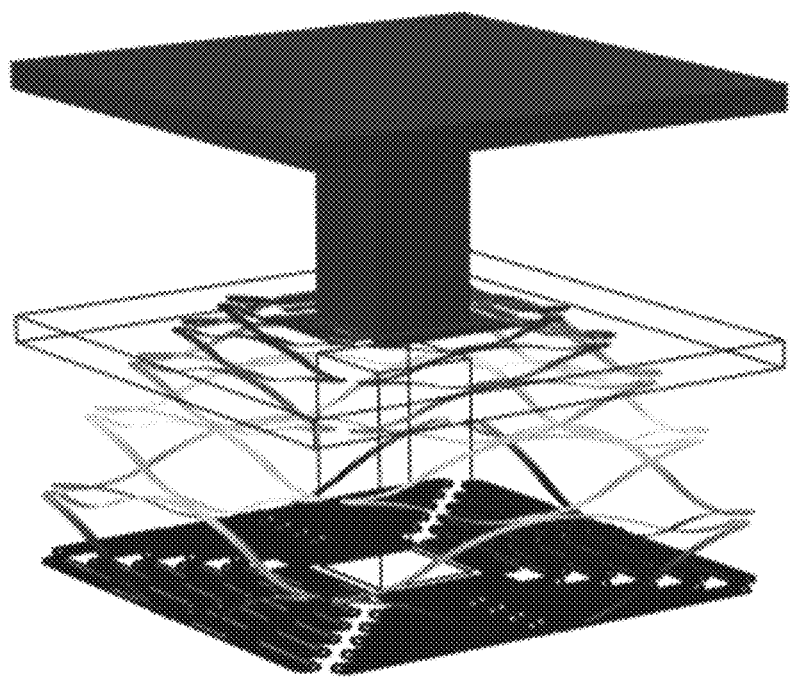
FIG. 1C illustrates a post release result of the systems showing an out-of-plane upward deflection as a result of the inherent residual stresses in the material layers as well as the different material CTE values.

FIGS. 1B and 1C illustrate another exemplary structural and conceptual design concept, which capitalizes on the inherent residual stress in stacked material layers resulting from the deposition process. In addition, this exemplary embodiment capitalizes on the different coefficient of thermal expansion (CTE) of the selected materials, which make up the stacked actuator structure. FIG. 1B also illustrates the overall design concept with the beam arrays 12 (actuators) attached to a central platform in which a mirror/post can be bonded to increase the fill-factor of an array. The bonding platform is used to integrate the actuator system assembly with the micromirror post and mirror plate assembly such that the complete system can enable the deflection and piston motion for the micromirror. In this exemplary embodiment, the entire actuation structure may also be fabricated using surface micromachining on a single wafer while the micromirror post and mirror may also be fabricated using an SEM wafer. An alternative to this approach may be to fabricate the actuation structure onto the micromirror wafer and then bond this structure to a pre-fabricated biasing wafer that has all associated bonding pads and wiring completed. FIG. 1C shows COMSOL® finite element modeling (FEM) results of the conceptual design illustrating the initial upward deflection of the actuator assembly which is created due to the inherent residual stress in the actuator (beam) assembly and the CTE difference of the deposited material layers, which make up the beam assemblies. This initial upward, out-of-plane deflection provides an initial, post-released peak out-of-plane displacement, which will enable the tip/tilt and piston motion of the micromirror assembly. All remaining deflections and piston motion will occur due to the controlled, user-driven bias voltages on the actuation assembly. The overall integration between the micromirror-post and the actuation system is through basic adhesion bonding to the actuator platform. A MEMS commercial foundry may also be used in addition to in-house fabrication to demonstrate the viability of the design and material impacts on the functionality of the system.

Figure 2A:
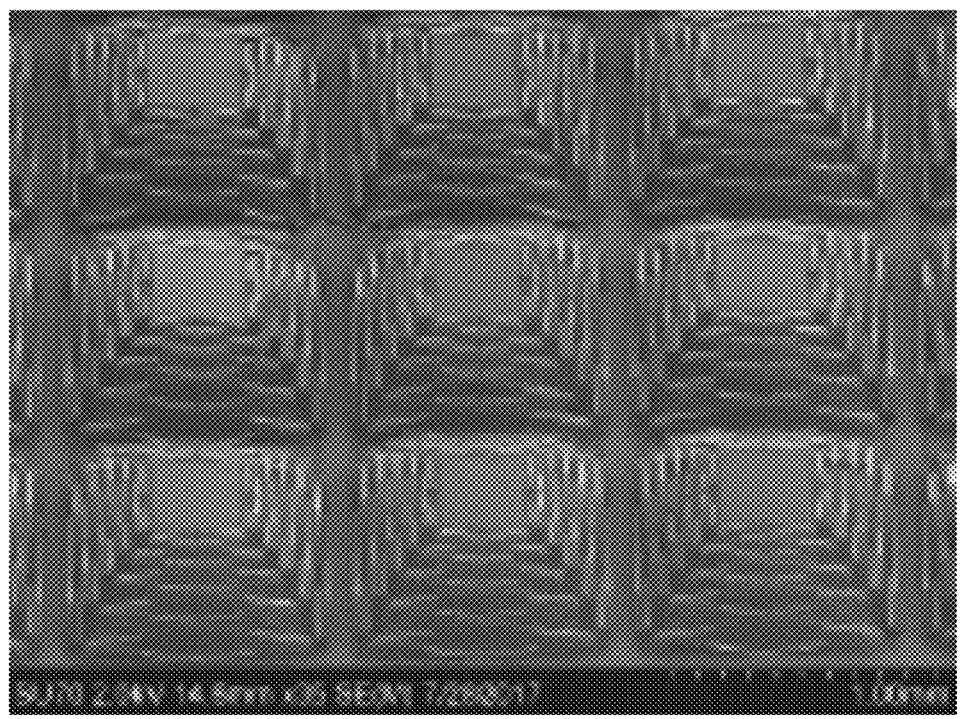
FIG. 2A shows a portion of a 5×5 array of the actuation structures, such as those in FIGS. 1A and 1B, illustrating an upward, out-of-plane deflection of the released actuation assemblies.
Figure 2B:
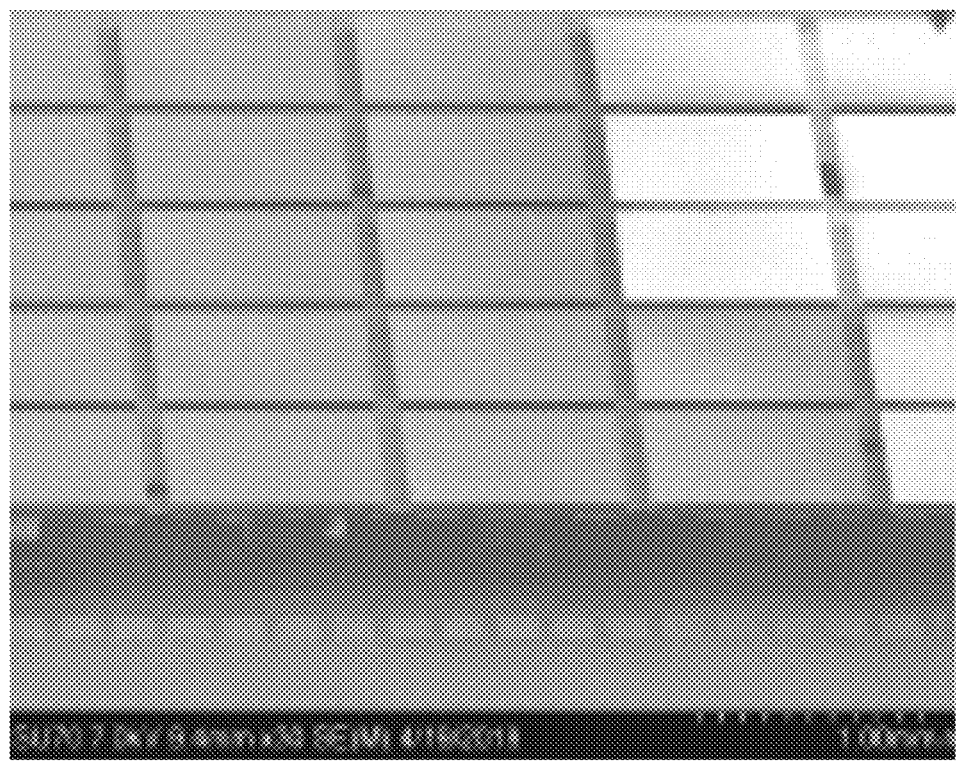
FIG. 2B illustrates a 5×5 array of micromirrors bonded to the actuators of FIG. 2A prior to release.

Using embodiments of the invention in this exemplary micromirror assembly design capitalizes on several of the more common actuation techniques in this approach to create the desired tip, tilt, and piston motion for the MEMS micromirrors. Presently, the largest deflection in MEMS micromirrors is based on using magnetics as the actuation method; however, the scan speed is several milliseconds, which fails to meet baseline metrics set forth for actuation speeds of less than 1 msec. Embodiments of the electrothermal design may also have potentially slow speeds due to the thermal response times for heating and cooling of the actuation assembly. Although these embodiments may have slower speeds, the benefits of using an electrothermal design is advantageous as they can represent simple fabrication methods, exhibit higher forces to deflect the micromirror, eliminate many of the nonlinearities associated with these structures, and can be biased with low voltages. The mirror may also be extremely flexible in that various coatings or material layers may be deposited on top of the mirror to be wavelength selective in steering. Another key advantage to this conceptual design approach is that it is easily scalable to larger array sizes which are advantageous for many applications as shown in FIGS. 2A and 2B. FIG. 2A illustrates a segment of a larger 5×5 array of actuator assemblies following the sacrificial oxide removal. From the image, the significant upward, out-of-plane deflection of the actuation structures can be seen. FIG. 2B shows the identical actuation assemblies with the micromirrors bonded to the platforms prior to sacrificial oxide release.

Figure 3A:
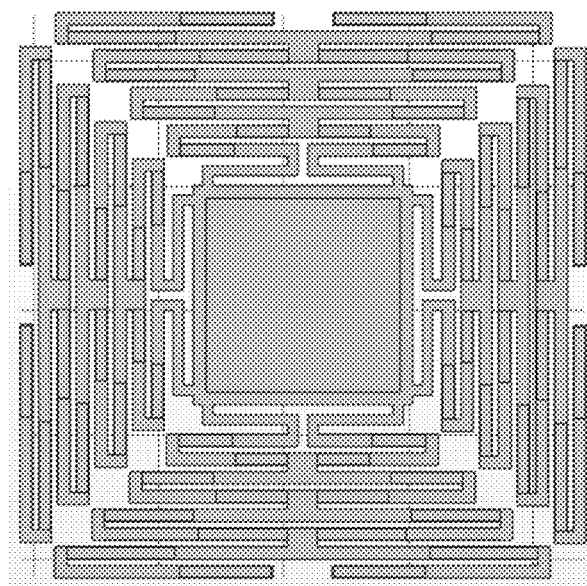
FIG. 3A is a MEMS structural device used for large angle beamsteering illustrating an exemplary embodiment with a center contact design.
Figure 3B:
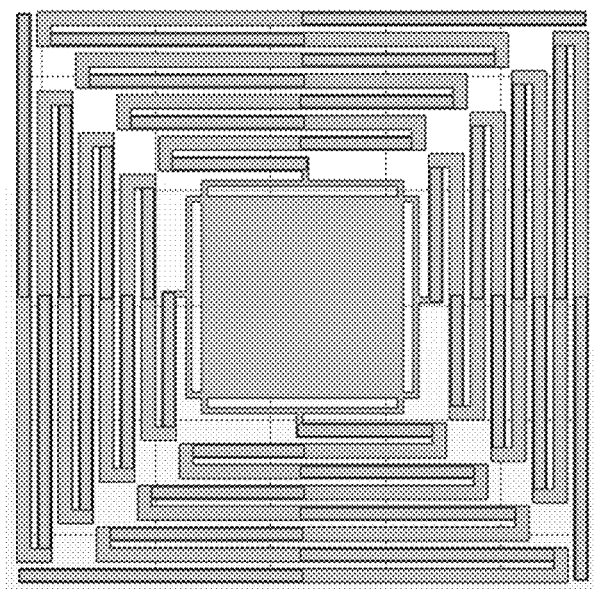
FIG. 3B is a MEMS structural device used for large angle beamsteering illustrating an exemplary embodiment with a serpentine based design with the contact at the end of the first, longest cantilever beam, which is a modification of the serpentine design in FIG. 3C.
Figure 3C:
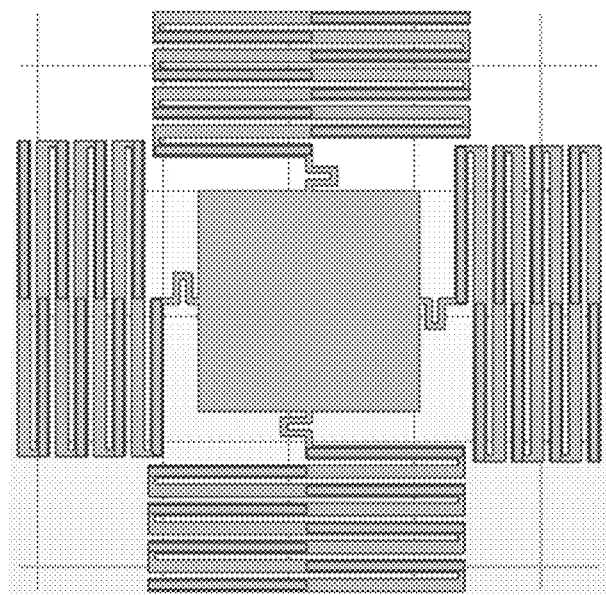
FIG. 3C illustrates and exemplary serpentine design shown.

The post mounted mirror embodiments may be mounted on a platform with several connection configurations as illustrated in FIGS. 3A-3C. Some of the main differences in operational performance between the exemplary connection configurations in FIGS. 3A, a center contact design, and 3B, a serpentine design, include: 1) the structural reliability of the center contact design is greater than the serpentine design, 2) the overall spring constant for the center contact design is much greater than the serpentine design, which may be advantageous in high vibration environments, and 3) the resonant frequency of the center contact is much higher than the serpentine design. Thus, there are a wide range of applications that could integrate either configuration to meet a desired application.

Figure 4A:
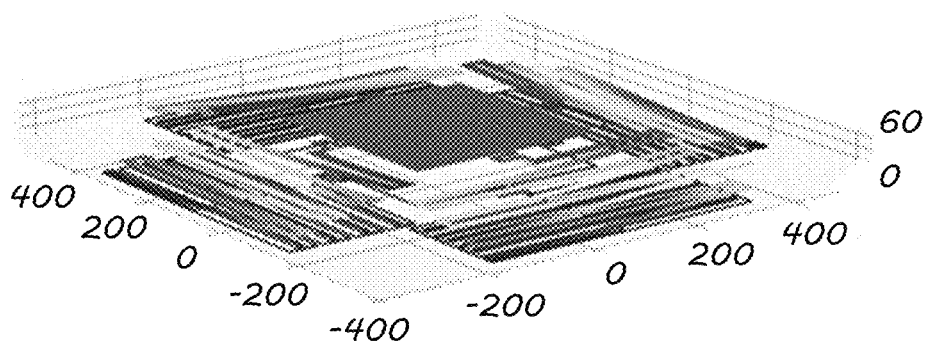
FIG. 4A illustrates the deflection of the serpentine design in FIG. 3C showing an upward deflection of about 60 µm.
Figure 4B:
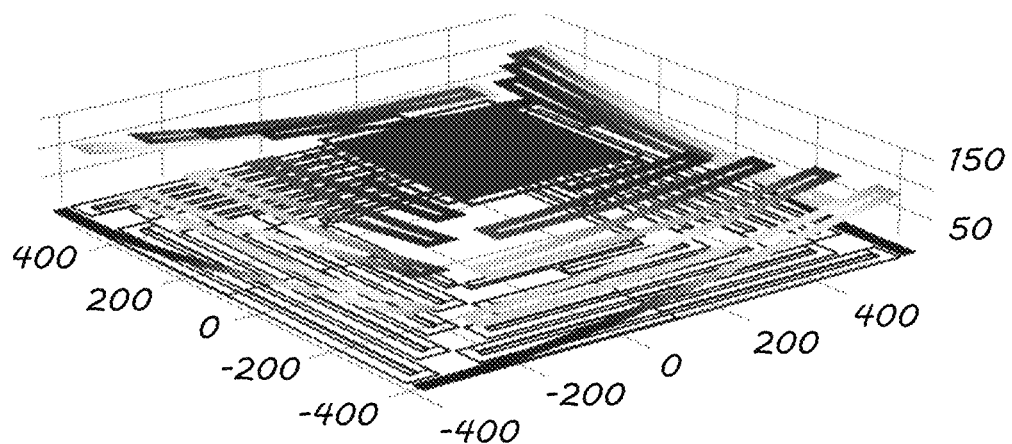
FIG. 4B illustrates the deflection of the modified serpentine design in FIG. 3B with an upward deflection of about 145 µm.

The exemplary embodiment of the serpentine design in FIG. 3B is an enhanced version of another exemplary 7-beam serpentine design as shown in FIG. 3C in which all bimorph actuator beams were set to the same length. The serpentine design in FIG. 3B utilizes available surface area of the wafer much better, which in turn aids in increasing the upward deflection. Both serpentine designs in FIGS. 3B and 3C operate with low power to provide large out-of-plane deflections while maintaining a high fill-factor once coupled with the micromirror assembly as shown in FIGS. 1A and 1B that are not possible in most MEMS actuators. The design shown in FIG. 3C where all beams are the same length provides a more linear control of the deflection when the actuator is biased appropriately. The modified design in FIG. 3B improves on several concepts. First, the initial upward deflection can be increased significantly within the same footprint from the original design as the bimorph beams are optimally lengthened to enhance upward deflection as illustrated in FIGS. 4A and 4B (deflecting approximately 60 µm and 145 µm respectively). And, second, the actuators spring constant is varied with respect to the bimorph beam lengths with the lowest spring constant coming from the longest beam and steadily increases as the bimorph beams are shortened approaching the bonding platform. Thus, downward control of the micromirror tip, tilt, and piston deflection is possible simply through varying the bias voltages on the actuator electrodes.

Figure 5A:
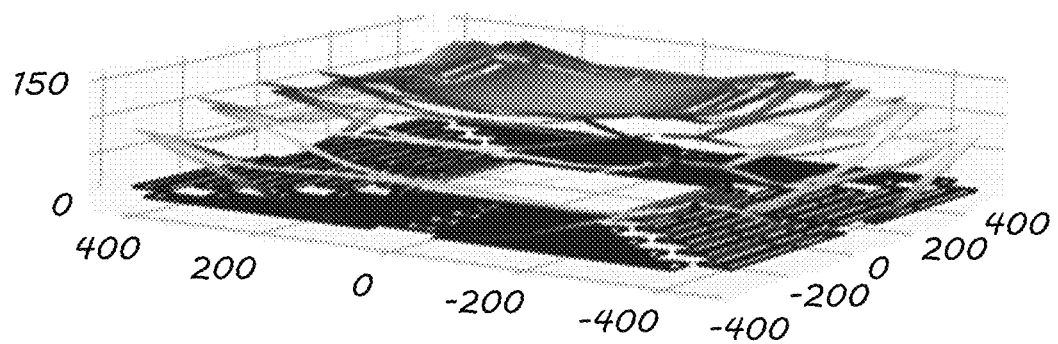
FIG. 5A illustrates a peak, upward beam deflection of 150 µm for identical center contact designs with the same physical actuator dimensions as shown in FIG. 3A with an aluminum metal layer.
Figure 5B:
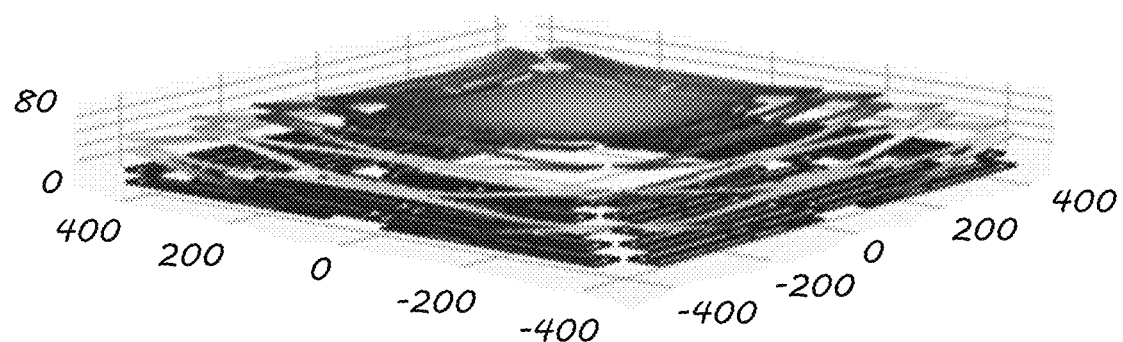
FIG. 5B illustrates a peak, upward beam deflection of 80 µm for identical center contact designs with the same physical actuator dimensions as shown in FIG. 1A with a gold metal layer.

FIGS. 5A and 5B illustrate the effect of changing the metal layer on the performance of the center contact design of FIG. 3A with identical physical bimorph beam dimensions. The only difference is the metal layer chosen within the bimorph beam from aluminum to gold. The initial upward deflection for the aluminum beam shown in FIG. 5A is approximately 150 µm while FIG. 5B shows the gold bimorph beam with only about 80 µm of deflection. For this minor material modification, the primary reason for the deflection difference was the difference in CTE and the difference in Young's modulus of the materials.

As set forth above, the large out-of-plane deflection is achieved by capitalizing on the materials inherent residual stress as well as the difference in the materials coefficient of thermal expansion (CTE) to form a bimorph design. In addition, the material thickness, beam lengths, the number of beams, the Young's Modulus, and the deposition of the multi-layers, which make up the beams all significantly contribute to the out-of-plane deflection. The actuation system is made up of four individually controlled bimorph electrothermal actuators 12a-12d, which enables system tip/tilt motion to achieve large angles as well as provide a linear piston motion if all four actuators are biased simultaneously. This is a very low voltage (<10V) system which operates on joule heating of the actuators which result in large downward forces to tip/tilt or piston drive the overall system. The preferred configuration would be an array of these actuation structures, which exhibit a high fill-factor to mitigate signal loss and maximize beam reflection/detection. The bimorph design methodology is provided below.

The actuator design concept capitalizes on the residual stress and the coefficient of thermal expansion (CTE) differences between the two layers. There are a wide range of alternatives to these electrothermal actuators. All one needs to verify is the residual stresses, Young's modulus, and the CTE of the selected materials meet the application requirements. The greater the difference in CTE values, the greater the possible deflections. The metal layers could be gold, aluminum, chromium, titanium, platinum, copper, and nickel, among others, while the dielectric layers could be silicon dioxide, silicon nitride, hafnium oxide, and aluminum oxide, among others. Various polymers could also be used to create these device structures but care would need to be taken to mitigate possible etching during the patterning and development of the structures. One of the key concepts in creating these structures is in the material selection such that there is a fairly large difference in CTE as well as the Young's modulus of the material. For example, if the dielectric used in the structure is silicon dioxide (Young's modulus=69 GPa, CTE=$0.7 \times 10^{-6}$ [1/K]) and the metal is aluminum (Young's modulus=70 GPa, CTE=$23.1 \times 10^{-6}$ [1/K]), the delta in the CTE will be $22.4 \times 10^{-6}$ [1/K]. A higher Young's Modulus will create a more rigid and stable structure but there are limits as bending must occur to create the tip and tilting of the platform from the actuators.

Figure 6A:
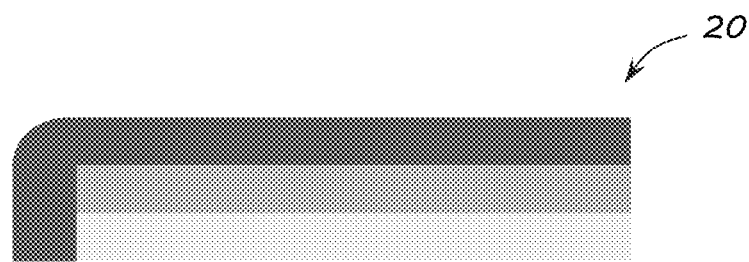
FIG. 6A is a baseline bimorph cantilever assembly prior to the removal of the sacrificial layer.
Figure 6B:
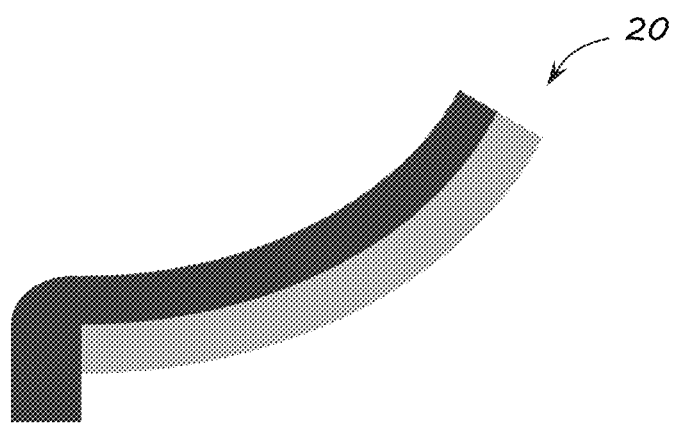
FIG. 6B illustrates the bimorph cantilever assembly of FIG. 6A following sacrificial layer removal/release.
Figure 7A:
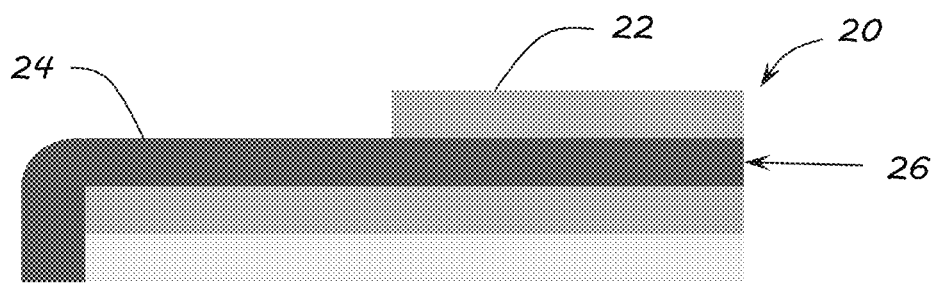
FIG. 7A is a modification of the bimorph cantilever assembly of FIG. 6A before release.
Figure 7B:
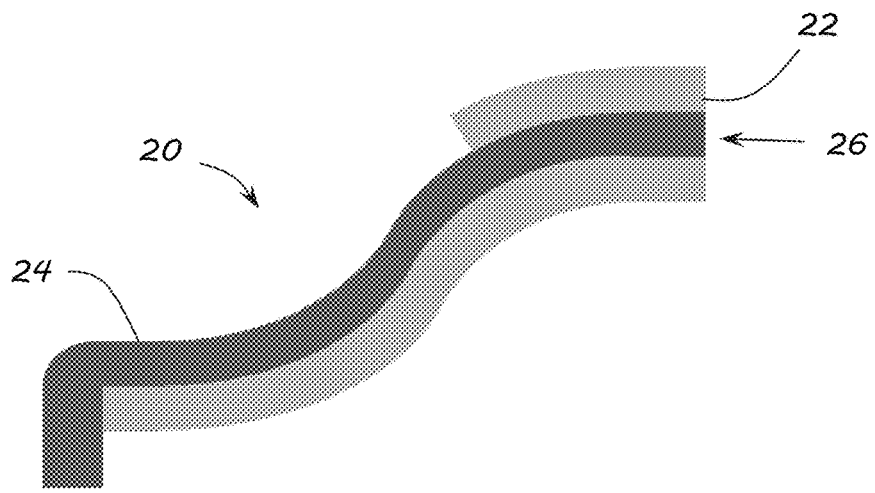
FIG. 7B illustrates the bimorph cantilever assembly of FIG. 7A after release.
Figure 8A:
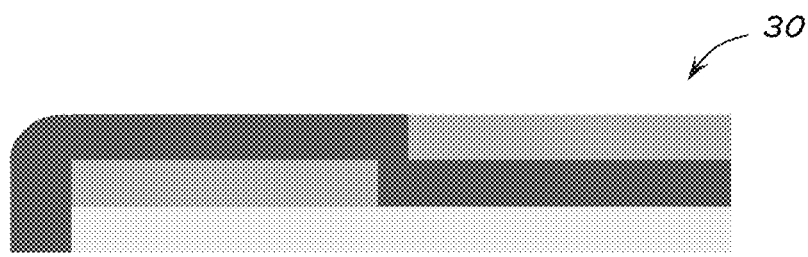
FIG. 8A is an alternate bimorph cantilever assembly with a split dielectric layer before release.
Figure 8B:
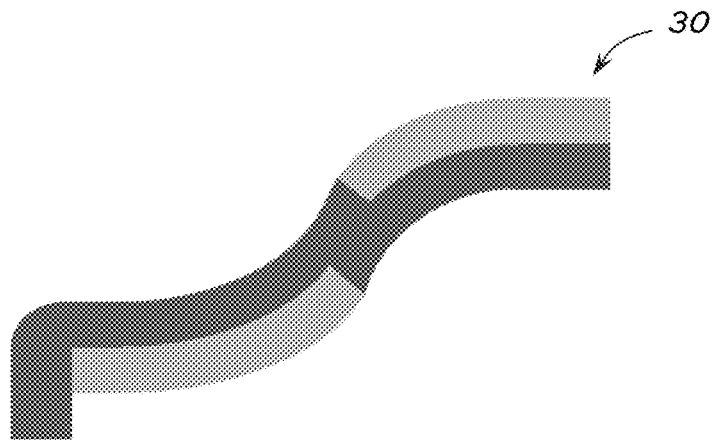
FIG. 8B illustrates the bimorph cantilever assembly of FIG. 8A after release.

One key aspect of this design approach as the images shown in FIGS. 6A and 6B illustrate is that a single bimorph 20 will deflect up while the next beam in the actuator will then return to the baseline position. In this condition, the arrayed beams, which make up the actuator design will produce zero micron of deflection. Thus, it is beneficial to deposit a dielectric material 22 on top of the metal beam layer 24 covering approximately half the length of the freestanding beam 20 where this dielectric is located near the end 26 of the freestanding structure as shown in FIGS. 7A and 7B. This top dielectric creates the appropriate bending moment at the freestanding end to create an S-shape such that each subsequent beam begins its initial deflection at the new, elevated position. The image illustrated in FIGS. 8A and 8B shows a slightly different design approach where the conduction paths used are segmented to create a true bimorph 30 and inverse bimorph design resulting in an S-shaped deflection.

In some embodiments, the electrothermal actuation system may be fabricated using surface micromachining in which thin material layers are deposited and photolithography patterned on the surface of the wafer. The electrothermal actuators may be fabricated via two processes, the PolyMUMPs foundry process as outlined below and an alternate fabrication process using aluminum, gold, silicon dioxide and silicon nitride, though other fabrication processes may also be used. These design concepts may be used as a key component in a wide variety of large angle beam steering approaches for platforms and UAVs. The structures may also be used for imaging and scene generation.

The PolyMUMPs fabrication process is outlined in Cowen et al., "PolyMUMPs™ Design Handbook, Revision 13.0.," MEMSCAP Inc., 3021 Cornwallis Road, Research Triangle Park, N.C., (2011), which is incorporated by reference herein in its entirety. FIG. 9A illustrates a cross sectional view of all deposition layers and the table in FIG. 9B outlines each layer thickness and layer functionality. The surface material layers are deposited by low pressure chemical vapor deposition (LPCVD). The sacrificial oxide layers, which consist of phosphosilicate glass (PSG) serve two purposes: 1) defines the gaps between structural layers, and 2) serves as the dopant source for the 1050° C. high temperature phosphorus diffusions to reduce the resistivity in the polysilicon structural layers. All surface layers are patterned using standard photolithography techniques and etched using Reactive Ion Etching (RIE). The final surface layer, a 0.5 μm-thick gold metallization layer with a 100 nm chrome adhesion layer is deposited and patterned using a standard lift-off technique. Lastly, a release etch is performed to remove the sacrificial oxide layers freeing the structural polysilicon layers (Poly1 and Poly2). The typical release etch is performed by immersing the die in room temperature hydrofluoric (49%) acid for 2-3 minutes, methanol rinses to stop the HF etch, and then a supercritical carbon dioxide ($CO_2$) rapid dry to minimize stiction of the actuation assemblies. One should note, that for the electrothermal actuators designed in this process, only the Poly2 and gold layers are used to create the foundation for further device development through the addition of other material layers. As shown in FIG. 9A, there is not a dielectric layer available to deposit and pattern onto the Poly2 and gold metal layers to create the necessary bending moment near the free ends of the beams. Thus, additional post processing steps may be performed to incorporate this top dielectric layer. For this foundry process, silicon nitride may be deposited as the dielectric layer, photo lithographically pattern and etch the nitride layer to meet design requirements. Silicon dioxide will not work in this foundry process as the sacrificial layer in this process is silicon dioxide and hydrofluoric acid is used to release this structure. If silicon dioxide is used as the top dielectric layer, it will also be etched away during the release process; thus, no upward deflection can occur.

A MEMS commercial foundry may also be used in addition to in-house fabrication efforts to make these large out-of-plane structures. As illustrated in the various figures, a designer has a wide range of options to meet there desired application goals from the physical size of the device, to material selections, to residual stress levels within these layers. From these options, designers can create low angle tip/tilt/piston driven devices to very large out-of-plane structures which enable large angle tip/tilt and piston motion.

Figure 10A:
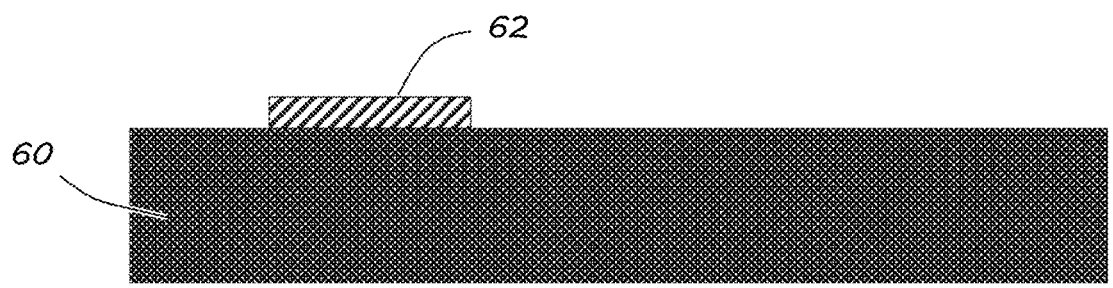
FIGS. 10A-10F illustrate a fabrication sequence of an electrothermal actuation assembly consistent with embodiments of the invention.
Figure 10B:
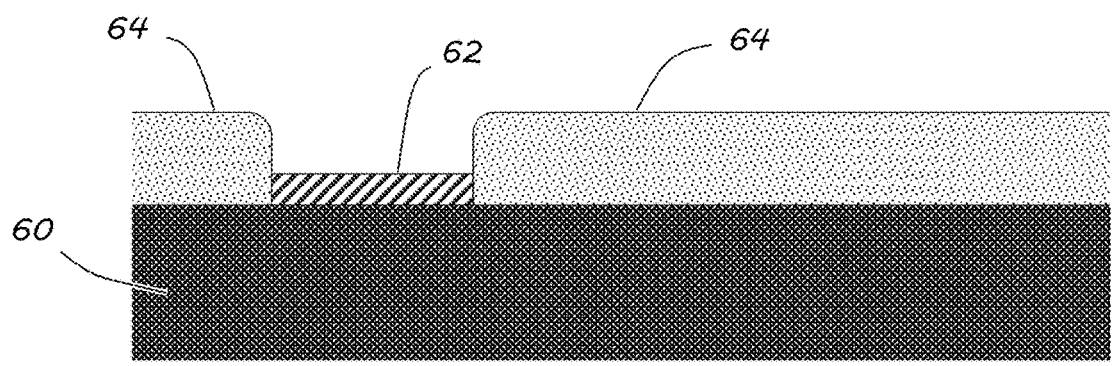
Figure 10C:
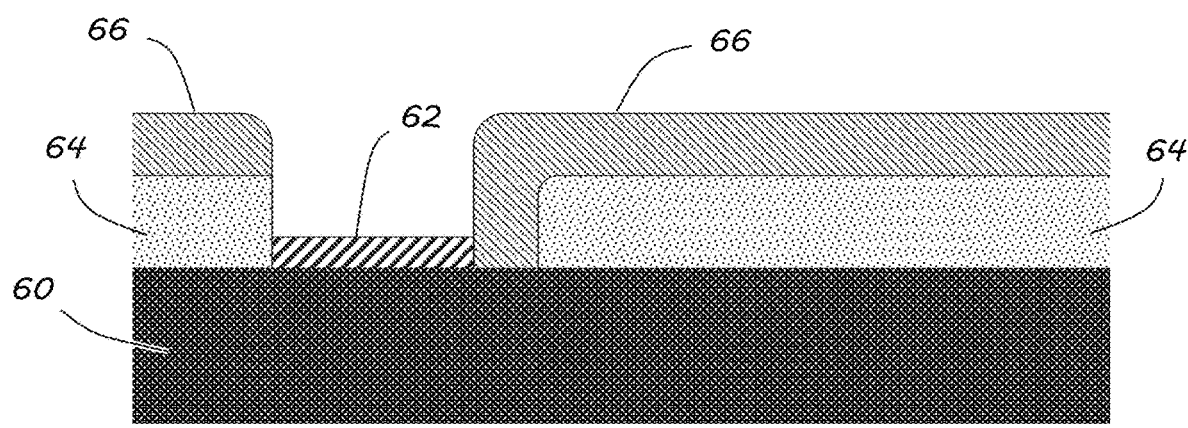
Figure 10D:
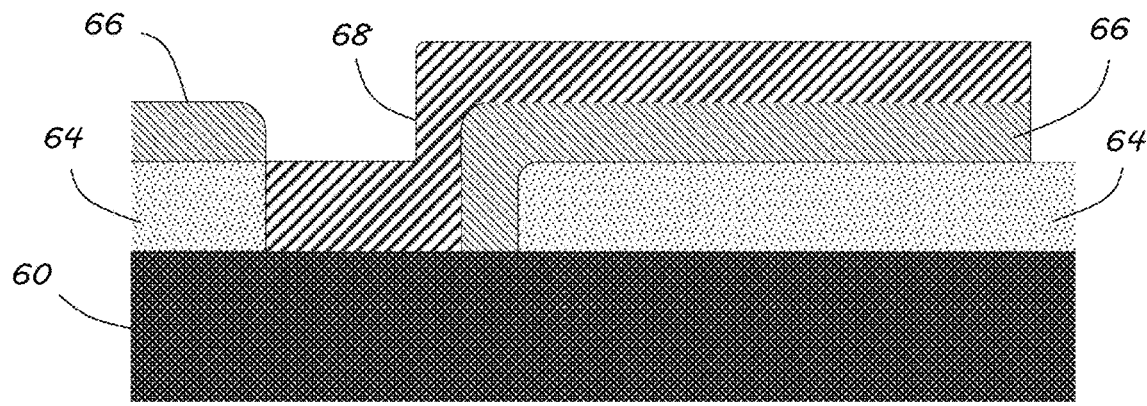
Figure 10E:
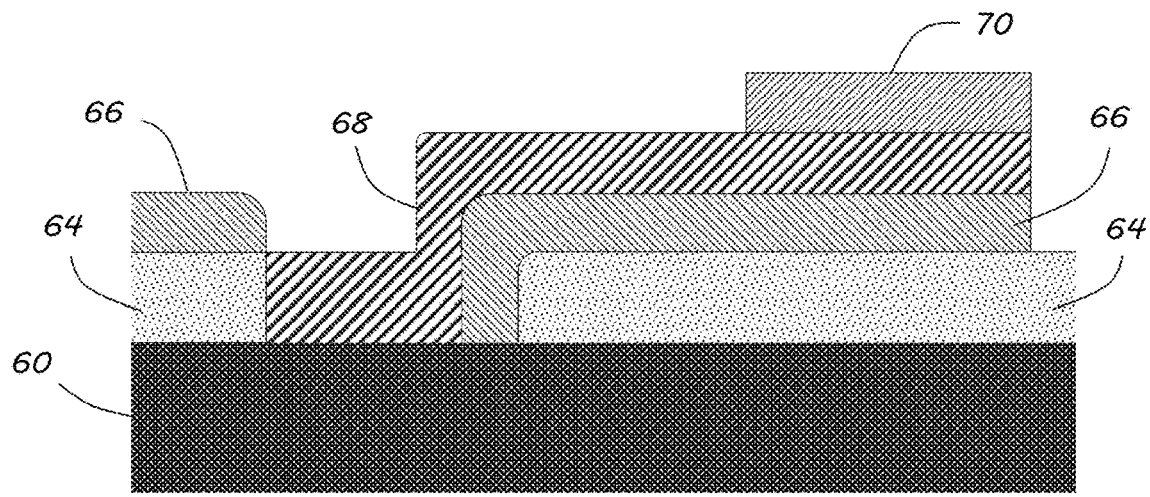
Figure 10F:
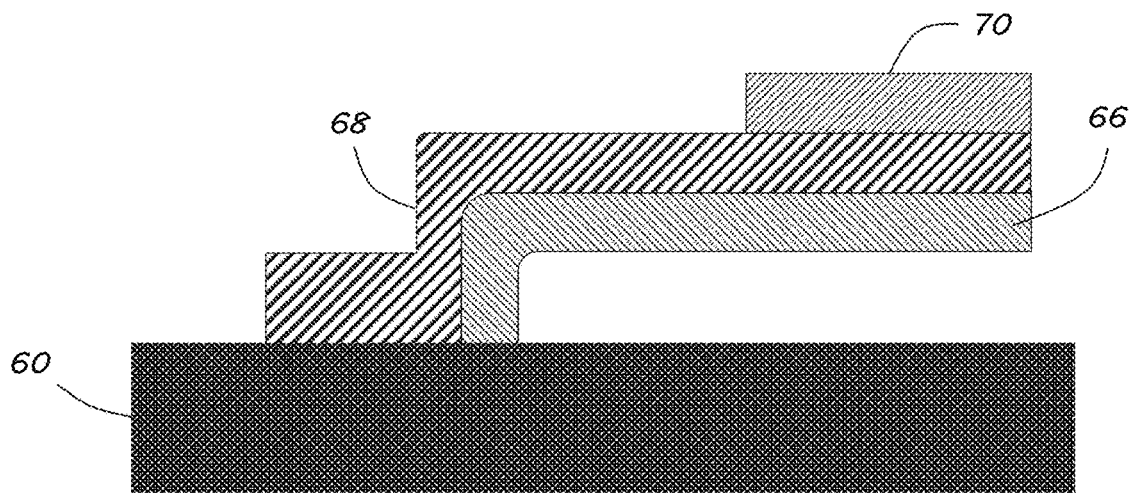

An alternate fabrication for embodiments of the electrothermal actuation assemblies is illustrated in FIGS. 10A-10F. An exemplary embodiment formed by the alternate fabrication process begins with a glass wafer 60 and deposit a 0.5 μm metal layer 62, which is used as the base and wiring metal as shown in FIG. 10A. This is followed by spin casting a layer of PMGI at 4000 RPMs, and a layer of Shipley 1805 photoresist. The 1805 photoresist is exposed to UV and then developed. Following development, the stacked resist is exposed to deep UV to pattern the PMGI layer and is again developed as illustrated in FIG. 10B to form the sacrificial layer 64. The wafer 60 is then placed on a 250° C. hotplate to reflow the PMGI layer. The reflow serves to round off the sharp edges to mitigate high stress locations and enable sidewall deposition coverage for the actuation assembly. The bottom dielectric material is then PECVD deposited and patterned at 200° C. to form the base layer 66 of the beams of the actuation assembly and is shown in FIG. 10C. The next step is to deposit and pattern a 1.0 μm metal layer 68 by evaporation to form the second layer of the bimorph structure as shown in FIG. 10D. Following the deposition of the beam metal layer, a second, top dielectric layer 70 of 1.0 μm is deposited using PECVD and patterned to finish the three layer stacked beam structures which make up the actuation assembly and is shown in FIG. 10E. This top dielectric is used to create the bending moment near the free standing ends of the beams to create the necessary S-shape to increase the elevation of the actuation structure. Lastly, the PMGI sacrificial layer is removed using an 1165 etchant (see FIG. 10F) which is then followed by a $CO_2$ critical point dry to fully release and dry the actuation assembly. All dielectric layers stated are etched using a reactive ion etch (RIE) system. Depending on the peak deflection needed, the dielectric materials are either silicon nitride or silicon dioxide while the metal beam material is typically either gold or aluminum.

There are a wide range of alternatives to this electrothermal actuator. All one needs to verify is the residual stresses and the CTE of the selected materials. The greater the difference in CTE values, the greater the possible deflections. In general, you need a metal layer to create the low resistive current path for the device to enable joule heating. These metals could be aluminum, platinum, gold, or any other low resistive metal. The primary structural layer can also be made from a wide variety of materials such as polysilicon, silicon nitride, silicon dioxide, numerous polymers or any other structural material which has a fairly large Young's modulus. The higher the Young's modulus, the more rigid and stable the structure will be but there are limits as bending must occur to create the tip and tilt for the actuators. The primary applications currently for these types of structures are in the medical field for endoscopy and other imaging systems. These devices could also be used in scanners, LIDAR, and likely EO/IR applications within the auto industry.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An actuator element of a MEMS device on a substrate to create large, out-of-plane deflection, the actuator element comprising:
    a metallic layer having a first portion contacting the substrate and a second portion having an end proximal to the first portion and distal end cantilevered over the substrate;
    a first insulating layer contacting the metallic layer on a bottom contacting surface of the second cantilevered portion from the proximal end to the distal end; and
    a second insulating layer contacting the metallic layer on a portion of a top contacting surface at the distal end, wherein the second portion of the metallic layer is prestressed,
    wherein a coefficient of thermal expansion of the first and second insulating layers is different than a coefficient of thermal expansion of the metallic layer, and
    wherein a Young's modulus of the first and second insulating layer is different than a Young's modulus of the metallic layer.

2. The actuator element of claim 1, wherein the portion of the top contacting surface spans from the distal end to a location half way between the proximal and distal ends.

3. The actuator element of claim 1, wherein the coefficient of thermal expansion of the first and second insulating layers is the same for both layers.

4. The actuator element of claim 1, wherein the coefficient of thermal expansion of the first insulating layer is different that the coefficient of thermal expansion of the second insulating layer.

5. The actuator element of claim 1, wherein the second portion of the metallic layer is tensilely prestressed.

6. The actuator element of claim 1, wherein a material of the metallic layer is selected from a group consisting of gold, aluminum, chromium, titanium, platinum, copper, nickel, and combinations thereof.

7. The actuator element of claim 1, wherein a material of the first and second insulating layers is selected from a group consisting of silicon dioxide, silicon nitride, hafnium oxide, aluminum oxide, and combinations thereof.

8. The actuator element of claim 1, wherein the metallic layer is a first metallic layer, the actuator element further comprising:
    a second metallic layer having a first portion of the second metallic layer contacting the distal end of the second portion of the first metallic layer and a second portion of the second metallic layer having an end proximal to the first portion of the second metallic layer and distal end cantilevered over the substrate;
    a third insulating layer contacting the second metallic layer on a bottom contacting surface of the second cantilevered portion of the second metallic layer from the proximal end to the distal end; and
    a fourth insulating layer contacting the second metallic layer on a portion of a top contacting surface at the distal end of the second metallic layer,
    wherein the second portion of the second metallic layer is prestressed,
    wherein a coefficient of thermal expansion of the third and fourth insulating layers is different than a coefficient of thermal expansion of the second metallic layer, and
    wherein a Young's modulus of the third and fourth insulating layer is different than a Young's modulus of the second metallic layer.

9. The actuator element of claim 8, wherein the coefficient of thermal expansion and Young's modulus of the third insulating layer is the same as the coefficient of thermal expansion and Young's modulus of the first insulating layer.

10. The actuator element of claim 8, wherein the coefficient of thermal expansion and Young's modulus of the fourth insulating layer is the same as the coefficient of thermal expansion and Young's modulus of the second insulating layer.

11. The actuator element of claim 8, wherein the portion of the top contacting surface of the second metallic layer spans from the distal end to a location half way between the proximal and distal ends.

12. The actuator element of claim 8, wherein the coefficient of thermal expansion of the third and fourth insulating layers is the same for both layers.

13. The actuator element of claim 8, wherein the coefficient of thermal expansion of the third insulating layer is different than the coefficient of thermal expansion of the fourth insulating layer.

14. The actuator element of claim 8, wherein the second portion of the second metallic layer is tensilely prestressed.

15. The actuator element of claim 8, wherein a material of the second metallic layer is selected from a group consisting of gold, aluminum, chromium, titanium, platinum, copper, nickel, and combinations thereof.

16. The actuator element of claim 8, wherein a material of the third and fourth insulating layers is selected from a group consisting of silicon dioxide, silicon nitride, hafnium oxide, aluminum oxide, and combinations thereof.

* * * * *